United States Patent [19]

Okamoto

[11] Patent Number: 5,834,962
[45] Date of Patent: Nov. 10, 1998

[54] LEVEL SHIFT CIRCUIT AND VOLTAGE CONTROLLED OSCILLATION CIRCUIT USING THE SAME

[75] Inventor: Masaaki Okamoto, Kawasaki, Japan

[73] Assignee: Fujitsu Limited, Kanagawa, Japan

[21] Appl. No.: 858,537

[22] Filed: May 19, 1997

[30] Foreign Application Priority Data

Oct. 30, 1996 [JP] Japan .................................. 8-288097

[51] Int. Cl.[6] .............................................. H03K 17/785
[52] U.S. Cl. ........................ 327/333; 327/306; 327/325; 327/309; 326/68
[58] Field of Search .................................... 327/427, 430, 327/431, 325, 333, 306, 309; 326/68

[56] References Cited

U.S. PATENT DOCUMENTS

| | | | |
|---|---|---|---|
| 3,748,498 | 7/1973 | Hoffman | 327/215 |
| 4,450,369 | 5/1984 | Schuermeyer | 326/68 |
| 4,728,821 | 3/1988 | Yang et al. | 326/68 |
| 4,896,061 | 1/1990 | Ahmed | 307/575 |
| 5,128,556 | 7/1992 | Hirakata | 326/68 |
| 5,323,071 | 6/1994 | Hirayama | 307/475 |

FOREIGN PATENT DOCUMENTS 362221217  9/1987  Japan ..................................... 327/430

*Primary Examiner*—Timothy P. Callahan
*Assistant Examiner*—An T. Luu
*Attorney, Agent, or Firm*—Nikaido Marmelstein Murray & Oram, LLP

[57] ABSTRACT

A level shift circuit includes a plurality of diodes connected in tandem in a forward direction, a normally-ON transistor connected between a high-potential power line and a node of a highest potential side among the plurality of diodes connected in tandem, and a first pull-down circuit connected between a node of a lowest potential side among the plurality of diodes connected in tandem and a low-potential power line. The level shift circuit further includes a second pull-down circuit connected between a node among the plurality of diodes and the low-potential power line. An input voltage is applied to a control electrode of the normally-ON transistor, and an output voltage is taken from the node of the lowest potential side among the plurality of diodes. By the constitution, the magnitude of a level shift can remain constant relative to a wide range of input voltages. Eventually, a linear input/output characteristic can be obtained.

4 Claims, 7 Drawing Sheets

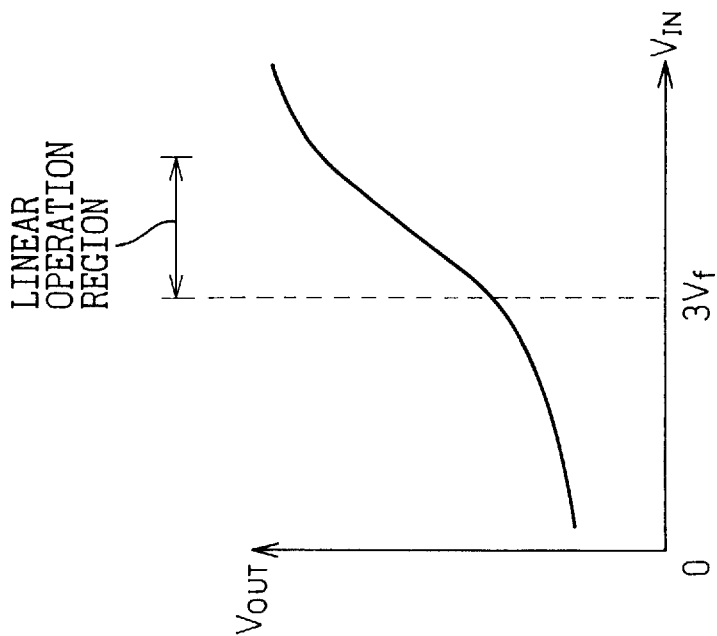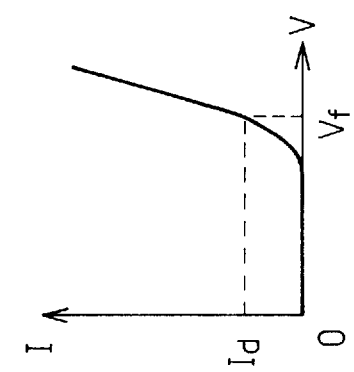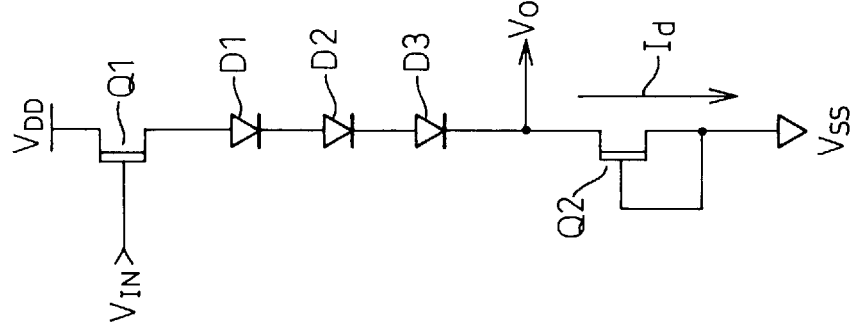

LEVEL SHIFT CIRCUIT AND VOLTAGE CONTROLLED OSCILLATION CIRCUIT USING THE SAME

BACKGROUND OF THE INVENTION

1. Field of the Invention

The present invention relates to a level shift circuit, or more particularly, to a level shift circuit adapted to a level setting circuit on the input stage of a wideband voltage controlled oscillation circuit (hereinafter, a VCO).

For example, when a VCO employed in a phase-locked loop (PLL) or the like is constructed in the form of an integrated circuit, unless level setting is carried out appropriately on the input stage of the VCO, the VCO exhibits a gain with a nonlinear characteristic. This leads to a drawback that a desired oscillation frequency cannot be attained with high precision relative especially to low input voltages. A circuit used for level setting on the input stage of the VCO is required to exhibit linearity in the operating characteristic thereof.

2. Description of the Related Art

FIG. 1a shows the circuitry of a level shift circuit as an example of a prior art, FIG. 1b shows a voltage-current (V-I) characteristic of a level shifting diode, and FIG. 1c shows an input/output characteristic.

As shown in FIG. 1a, the level shift circuit is constructed by connecting a source-follower depletion field-effect transistor (hereinafter FET) Q1, three diodes D1 to D3 connected in tandem in a forward direction, and a pull-down circuit (depletion FET Q2 having a gate thereof strapped to a source thereof) in series with one another between a high-potential power line $V_{DD}$ and a low-potential power line $V_{SS}$. An input voltage $V_{IN}$ is applied to the gate of the transistor Q1, and an output voltage $V_{OUT}$ is taken from the cathode of the diode D3. The magnitude of a level shift is expressed as $V_{IN}-V_{OUT}$.

In FIG. 1b, Vf denotes a drop in forward voltage occurring at each diode, Id denotes a current flowing when the forward voltage at each of the diodes D1 to D3 is Vf, that is, a current flowing into the power line $V_{SS}$ via the transistor Q2.

In the circuitry shown in FIG. 1A, the depletion FET Q2 is used as a pull-down circuit for routing a current to the power line $V_{SS}$. When a voltage is relatively high, the transistor functions almost as a constant-current source. When a voltage is relatively low, the transistor functions as a resistor.

In other words, as already known among those with an ordinary skill in the art, the V-I characteristic of a depletion FET is such that a current remains substantially constant relative to voltages equal to or larger than a certain value, and the current decreases accordingly relative to relatively low voltages.

In terms of a whole level shift circuit, as shown in FIG. 1c, when $V_{IN}$ is higher than 3 Vf, the forward voltage at each of the diodes D1 to D3 becomes Vf, and the magnitude of a level shift is retained at a constant value of 3 Vf. The output voltage $V_{OUT}$ substantially equals to $V_{IN}$ _3 Vf. The input/output characteristic becomes linear.

By contrast, when $V_{IN}$ is lower than 3 Vf, the forward voltage at each of the diodes D1 to D3 is lower than Vf. A current Id flowing into the transistor Q2 decreases accordingly (See FIG. 1b), and the output voltage $V_{OUT}$ gets relatively high. The magnitude of a level shift ($V_{IN}-V_{OUT}$) decreases, and the input/output characteristic becomes nonlinear.

As mentioned above, in a known level shift circuit, when the range of input voltages is wide and the magnitude of a level shift is large, the magnitude of a level shift occurring at each diode relative to a range of relatively low input voltages decreases relatively. This poses a drawback that the magnitude of a level shift cannot remain constant relative to the whole range of input voltages. That is to say, there is a problem that a linear operation region becomes relatively narrow.

When such a level shift circuit is adopted as, for example, a level setting circuit on the input stage of a VCO, gains provided by the VCO relative to low input voltages decrease. This poses a problem that the level shift circuit cannot be employed in a wideband VCO.

SUMMARY OF THE INVENTION

An object of the present invention is to provide a level shift circuit capable of retaining the magnitude of a level shift at a constant value relative to a wide range of input voltages, and of eventually exhibiting a linear input/output characteristic.

According to the present invention, there is provided a level shift circuit comprising: a plurality of diodes connected in tandem in a forward direction; a normally-ON transistor connected between a high-potential power line and a node of a highest potential side among the plurality of diodes connected in tandem; a first pull-down circuit connected between a node of a lowest potential side among the plurality of diodes connected in tandem, and a low-potential power line; and a second pull-down circuit connected between a node among the plurality of diodes connected in tandem and the low-potential power line. In the level shift circuit, an input voltage is applied to a control electrode of the normally-ON transistor, and an output voltage is taken from the node of the lowest potential side among the plurality of diodes connected in tandem.

According to the circuitry of a level shift circuit of the present invention, a current is routed from an intermediate node among a plurality of diodes into a low-potential power line by means of a second pull-down circuit. When an input voltage is relatively low, a current flowing from the intermediate node into each diode connected on a high-potential side is larger than a current routed from the intermediate node into the low-potential power line through each diode connected on a low-potential side by means of a first pull-down circuit. In other words, a forward voltage (the magnitude of a level shift) developing at each diode connected on the high-potential side in proportion to a current flowing from the intermediate node can be increased relatively in relation to a forward voltage (the magnitude of a level shift) developing at each diode connected on the low-potential side in proportion to a current flowing from the intermediate node.

In other words, compared with the prior art in which the second pull-down circuit of the present invention is not included, the ratio of a drop in forward voltage at each diode to the forward voltage relative to low input voltages can be minimized.

Compared with the prior art, therefore, the magnitude of a level shift can remain constant relative to a wider range of input voltages. Eventually, a linear operation region in an input/output characteristic can be widened.

The level shift circuit of the present invention can preferably be used as a level setting circuit on the input stage of, for example, a wideband VCO.

BRIEF DESCRIPTION OF THE DRAWINGS

Other objects and features of the present invention will be described hereinafter in detail by way of preferred embodiments with reference to the accompanying drawings, in which:

FIGS. 1a to 1c are diagrams showing the circuitry of a level shift circuit as an example of a prior art, and the operation characteristic thereof;

DESCRIPTION OF THE PREFERRED EMBODIMENTS

Figure 2:
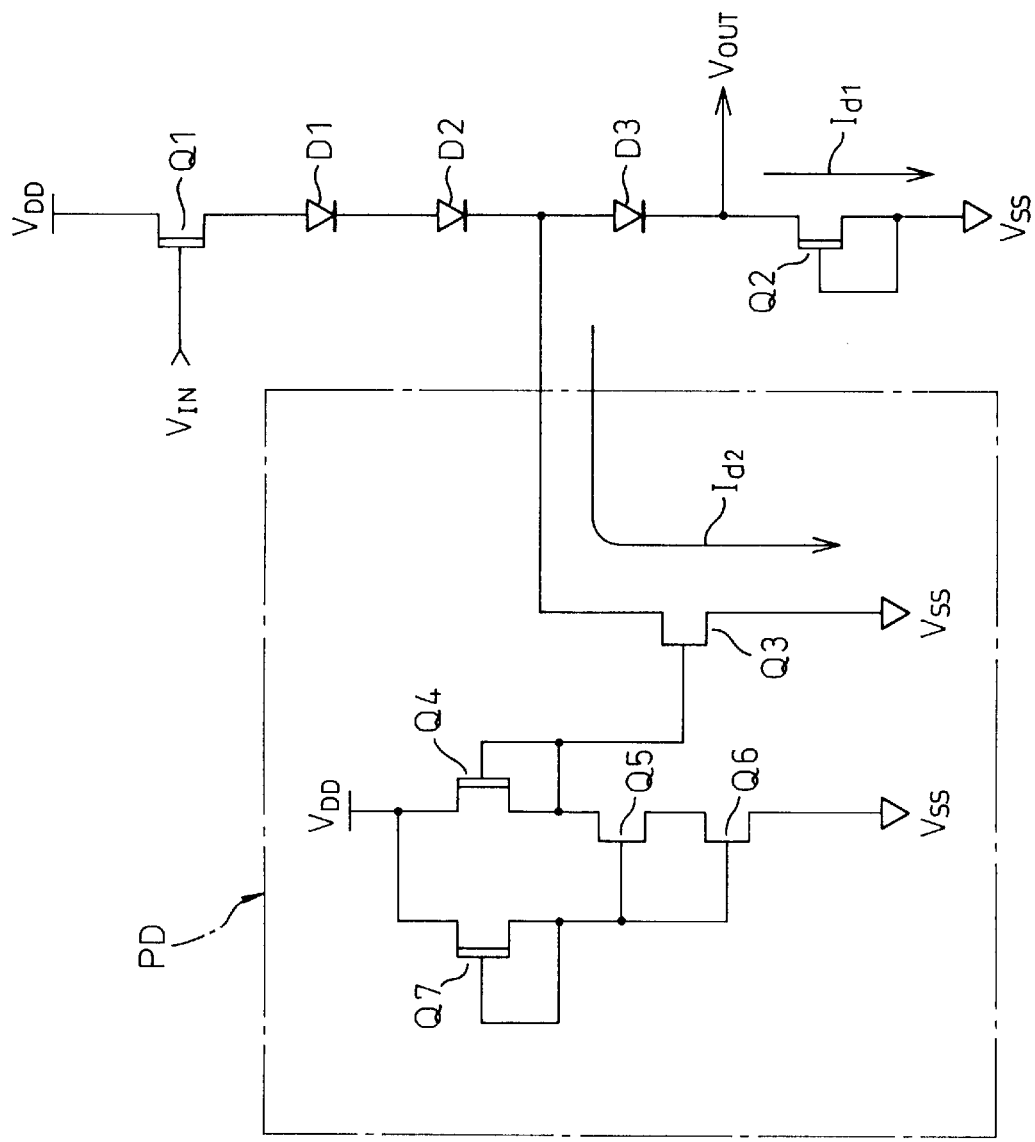
FIG. 2 is a circuit diagram showing the circuitry of a level shift circuit of an embodiment of the present invention.

FIG. 2 shows the circuitry of a level shift circuit in accordance with an embodiment of the present invention.

As shown in FIG. 2, the level shift circuit of this embodiment is constructed by connecting a normally-ON transistor (source-follower depletion FET Q1), a plurality of diodes (three diodes D1 to D3) connected in tandem in a forward direction, and a first pull-down circuit (depletion FET Q2 having a gate thereof strapped to a source thereof) in series with one another between a high-potential (for example, 3.3 V) power line $V_{DD}$ and a low-potential (for example, 0 V) power line $V_{SS}$. An input voltage $V_{IN}$ is applied to the gate of the transistor Q1, and an output voltage (level shift output) $V_{OUT}$ is taken from the cathode of the diode D3. The magnitude of a level shift is expressed as $V_{IN}-V_{OUT}$. The above components are identical to those of the prior art shown in FIG. 1a. However, in this embodiment, a current flowing into the power line $V_{ss}$ through the transistor Q2 is $Id_1$.

Furthermore, this embodiment is characterized in that, in addition to the above components, a second pull-down circuit PD is connected between an intermediate node among the three diodes D1 to D3 (a node between the diodes D2 and D3 in the illustrated example) and the low-potential power line $V_{SS}$.

The second pull-down circuit PD includes an enhancement-mode FET Q3 for drawing out a current from the intermediate node (a node between the diodes D2 and D3), and a bias generation circuit for controlling a current $Id_2$ flowing into the power line $V_{SS}$ via the transistor Q3.

The bias generation circuit includes a pair of depletion FETs Q4 and Q7 having drains thereof connected to the power line $V_{DD}$ and gates thereof strapped to sources thereof, and two enhancement-mode FETs Q5 and Q6 connected in series with each other between the source of the transistor Q4 and the power line $V_{SS}$, and having gates thereof connected to the source of the transistor Q7.

The bias generation circuit is connected as mentioned above, and therefore functions as a NAND gate as a whole. An output of the bias generation circuit (a voltage developing at the source of the transistor Q4) is applied to the gate of the transistor Q3 for drawing out the current $Id_2$ from the intermediate node among the three diodes D1 to D3. When a level shift voltage at each diode varies due to a temperature change, if the current $Id_2$ flowing from the intermediate node into the power line $V_{SS}$ changes, the bias generation circuit gives control so as to compensate for the change in current $Id_2$. That is to say, the bias generation circuit has the ability to compensate the temperature characteristic of the level shift voltage developed at each diode.

Figure 3A:
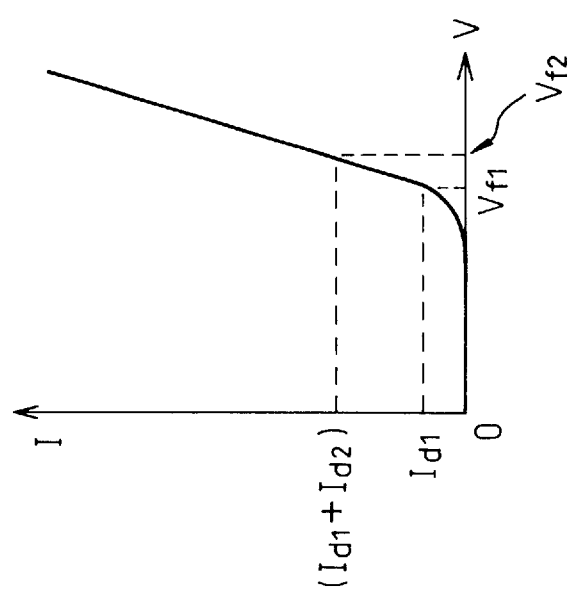
FIGS. 3a and 3b are diagrams showing the operation characteristic of the circuit shown in FIG. 2.
Figure 3B:
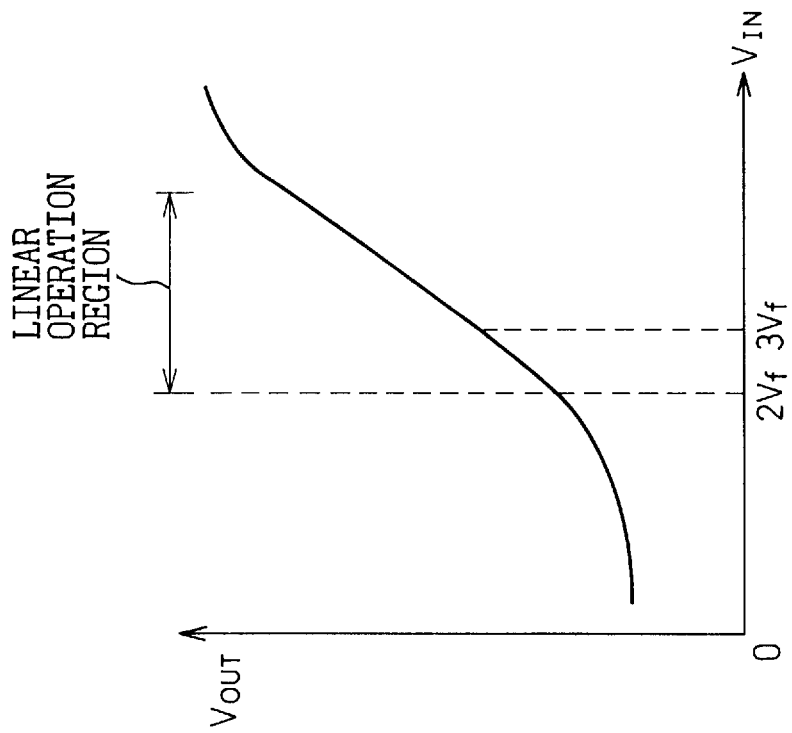

FIG. 3a shows the V-I characteristic of a level shifting diode employed in the level shift circuit of this embodiment, and FIG. 3b shows the input/output characteristic of the level shift circuit.

The V-I characteristic shown in FIG. 3a indicates that: when the input voltage $V_{IN}$ is relatively low, a current $Id_1+Id_2$ flows from the intermediate node into the diodes D1 and D2 connected on the high-potential side, and the forward voltage developing at each diode at this time is $Vf_2$; in contrast, a current $Id_1$ flows from the intermediate node into the diode D3 connected on the low-potential side, and the forward voltage developing at this time is $Vf_1$. In short, the forward voltage developing at each of the diodes D1 and D2 (the magnitude of a level shift) is higher than the forward voltage developing at the diode D3 (the magnitude of a level shift).

According to the circuitry of the level shift circuit of this embodiment, owing to the operation of the pull-down circuit PD connected to the intermediate node, as shown in the graph of FIG. 3b plotting the input/output characteristic, when $V_{IN}$ is lower than 3 Vf (especially when $V_{IN}$ is higher than 2 Vf), the magnitude of a level shift occurring at the diode D3 decreases, while the magnitudes of level shifts occurring at the diodes D1 and D2 hardly decrease but remain constant. Compared with the prior art (See FIG. 1c), the linear operation region in the input/output characteristic can be widened. That is to say, the magnitude of a level shift can remain nearly constant relative to a wide range of input voltages.

For the above reason, the level shift circuit of this embodiment can preferably be used as a level setting circuit on the input stage of, for example, a wideband VCO.

Owing to the operation of the bias generation circuit (transistors Q4 to Q7) constituting part of the pull-down circuit PD, the temperature characteristic of the level shift voltage at each of the diodes D1 to D3 can be compensated for.

Figure 4:
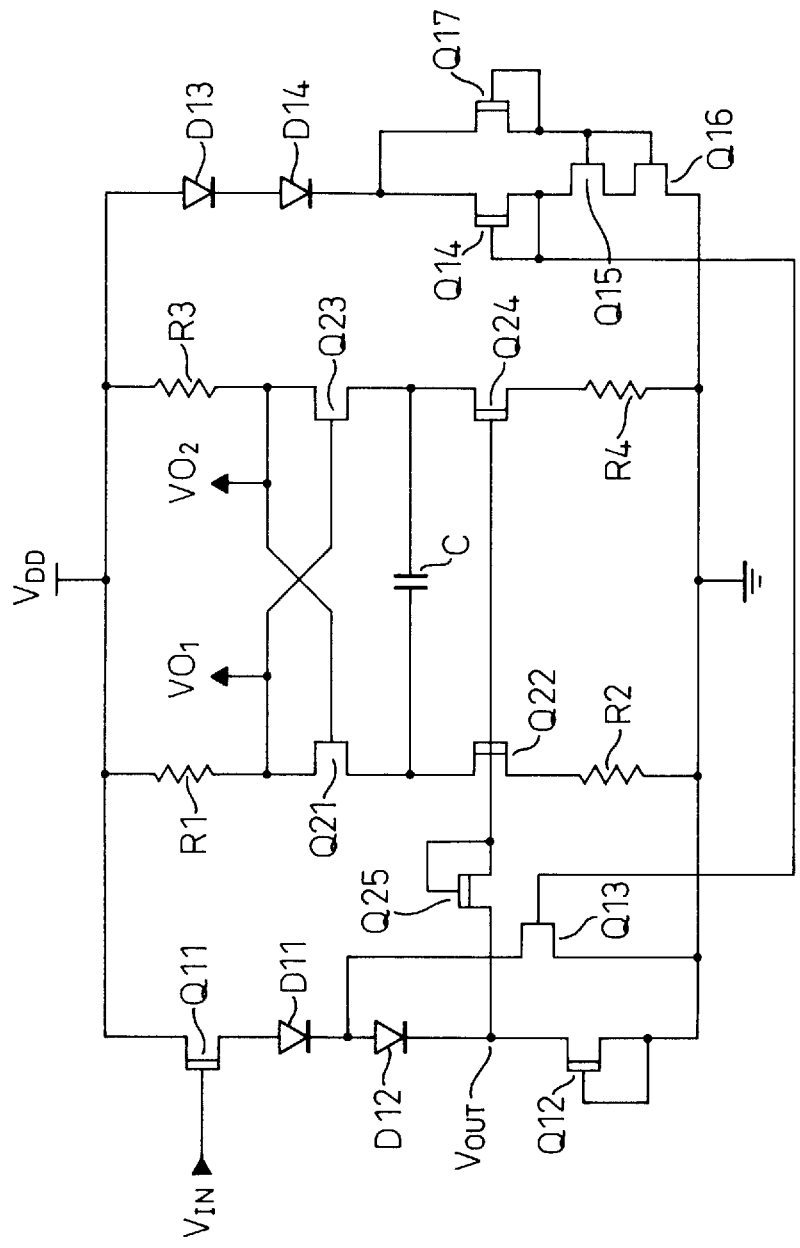
FIG. 4 is a circuit diagram showing a first example of the circuitry of a VCO employing the level shift circuit in accordance with the present invention.
Figure 5:
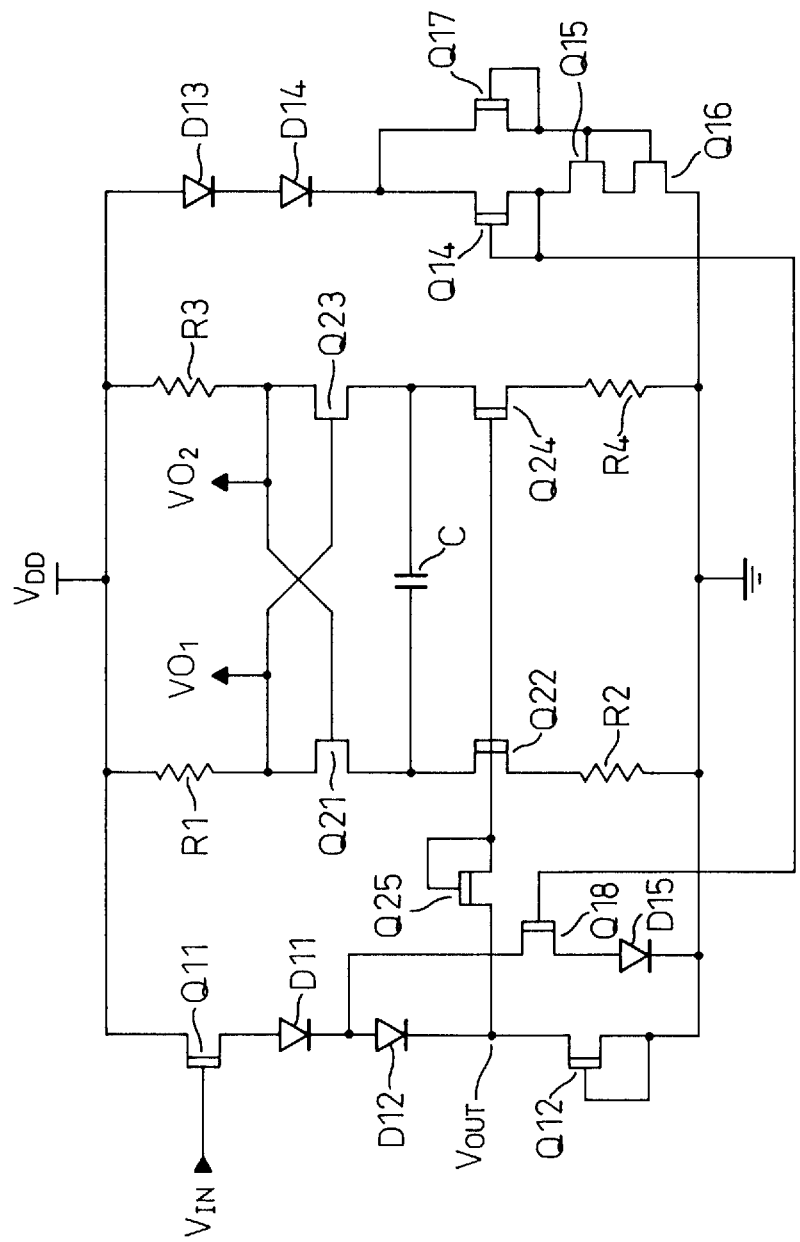
FIG. 5 is a circuit diagram showing a second example of the circuitry of a VCO employing the level shift circuit in accordance with the present invention.
Figure 6:
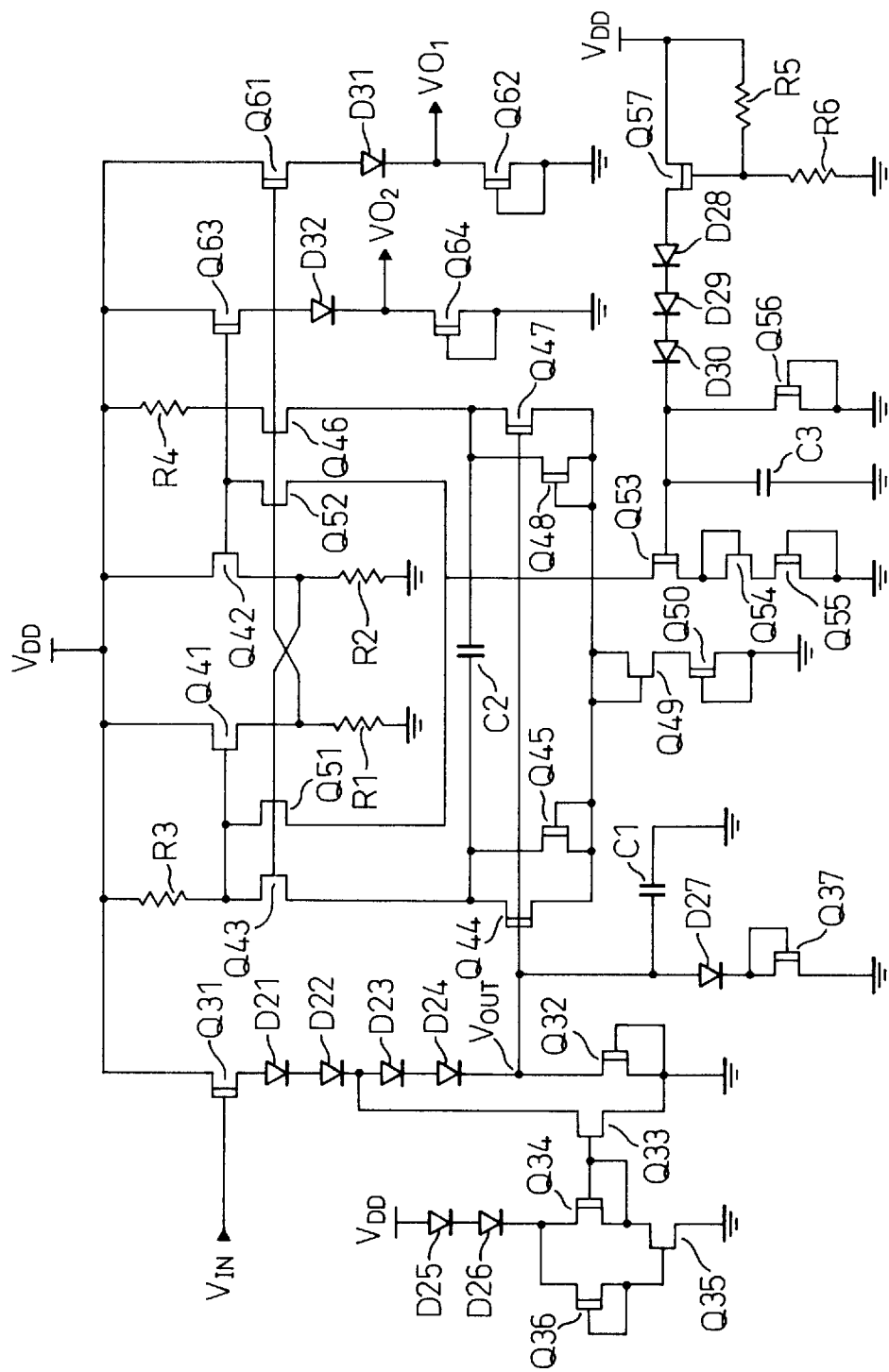
FIG. 6 is a circuit diagram showing a third example of the circuitry of a VCO employing the level shift circuit in accordance with the present invention.

FIGS. 4, 5, and 6 show examples of the circuitry of a VCO employing the level shift circuit in accordance with the present invention.

A first example of the circuitry of a VCO shown in FIG. 4 includes depletion FETs Q11, Q12, Q14, Q17, Q22, Q24, and Q25, enhancement-mode FETs Q13, Q15, Q16, Q21, and Q23, and diodes D11 to D14, resistors R1 to R4, and a capacitor C. Among the components, the transistors Q11 to Q17 and the diodes D11 to D14 constitute the foregoing level shift circuit. The oscillation frequency of the VCO can be determined with the capacitance of the capacitor C. A supply voltage $V_{DD}$ employed in the VCO is 3.3 V.

A second example of the circuitry of a VCO shown in FIG. 5 includes the same components as the first example except that a depletion FET Q18 and diode D15 are substituted for the enhancement-mode FET Q13.

A third example of the circuitry of a VCO shown in FIG. 6 includes depletion FETs Q31, Q32, Q34, Q36, Q37, Q44, Q45, Q47, Q48, Q50, Q53, Q55 to Q57, and Q61 to Q64, enhancement-mode FETs Q33, Q35, Q41 to Q43, Q46, Q49, Q51, Q52, and Q54, diodes D21 to D32, resistors R1 to R6, and capacitors C1 to C3. Among these components, the transistors Q31 to Q36 and the diodes D21 to D26 constitute the aforesaid level shift circuit. Moreover, the oscillation frequency of the VCO is determined with the capacitance of the capacitor C2. In the illustrated circuitry, a supply voltage $V_{DD}$ is 5.0 V.

Figure 7:
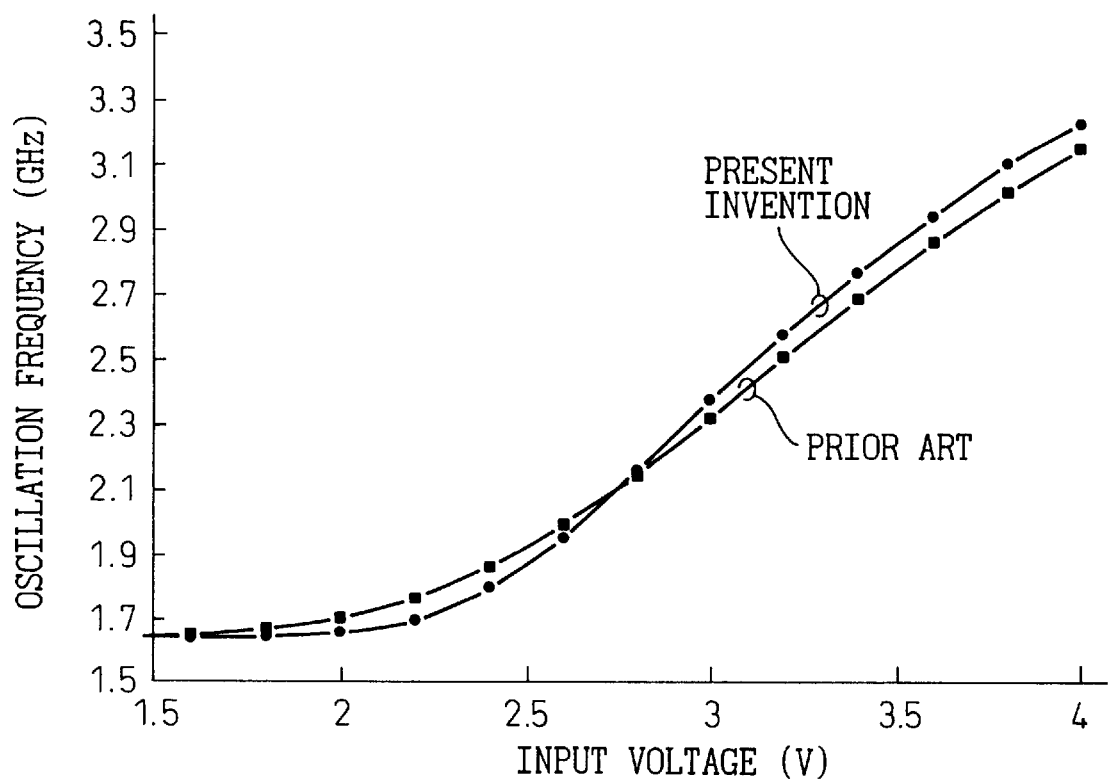
FIG. 7 is a diagram showing an example of the operation characteristic of a VCO employing the level shift circuit in accordance with the present invention, which is obtained through simulation, in comparison with that in accordance with the prior art.

FIG. 7 shows, for reference, an example of the operation characteristic of a VCO in accordance with the present invention, which is obtained through simulation, in comparison with that in accordance with the prior art.

As illustrated, in the prior art, when the magnitude of a level shift on an input stage is increased (shifted rightward in the drawing), a gain by the VCO decreases. In the present invention, while a decrease in gain is suppressed, the magnitude of a level shift can remain nearly constant relative to a wide range of input voltages.

What is claimed is:

1. A level shift circuit comprising:

a plurality of diodes connected in tandem in a forward direction;

a normally-ON transistor connected between a high-potential power line and a node of a highest potential side among said plurality of diodes connected in tandem;

a first pull-down circuit connected between a node of a lowest potential side among said plurality of diodes connected in tandem, and a low-potential power line; and a second pull-down circuit connected between a node among said plurality of diodes connected in tandem, and said low-potential power line, wherein said second pull-down circuit includes a transistor for drawing out a current from said node among said plurality of diodes connected in tandem, and a bias generation circuit for controlling a current flowing into said low-potential power line via said transistor, wherein an input voltage is applied to a control electrode of said normally ON-transistor, and an output voltage is taken from said node of the lowest potential side among said plurality of diodes connected in tandem.

2. The level shift circuit as set forth in claim 1, wherein said bias generation circuit includes: first and second depletion field-effect transistors having drains thereof connected to said high-potential power line and having gates thereof strapped to sources thereof; and at least one enhancement-mode field-effect transistor, connected between the source of said first depletion field-effect transistor and said low-potential power line, having a gate thereof connected to the source of said second depletion field-effect transistor.

3. The level shift circuit as set forth in claim 1, wherein said first pull-down circuit includes a depletion field-effect transistor having a gate thereof strapped to a source thereof.

4. The level shift circuit as set forth in claim 1, wherein said normally-ON transistor is a depletion field-effect transistor having said input voltage applied to a gate thereof.

* * * * *